(12) United States Patent
Wu et al.

(10) Patent No.: US 9,281,195 B2
(45) Date of Patent: Mar. 8, 2016

(54) SEMICONDUCTOR STRUCTURE

(71) Applicant: MACRONIX International Co., Ltd., Hsin-Chu (TW)

(72) Inventors: Guan Wei Wu, Kaohsiung County (TW); Yao Wen Chang, Hsinchu (TW); I Chen Yang, Changhua County (TW); Tao Cheng Lu, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 21 days.

(21) Appl. No.: 13/855,479

(22) Filed: Apr. 2, 2013

(65) Prior Publication Data

US 2014/0264378 A1    Sep. 18, 2014

Related U.S. Application Data

(60) Provisional application No. 61/778,342, filed on Mar. 12, 2013.

(51) Int. Cl.
*H01L 29/16* (2006.01)
*H01L 21/265* (2006.01)
*G11C 16/04* (2006.01)
*H01L 21/28* (2006.01)
*H01L 29/792* (2006.01)
*H01L 27/115* (2006.01)
*H01L 29/78* (2006.01)
*H01L 29/165* (2006.01)
*G11C 11/56* (2006.01)
*G11C 16/34* (2006.01)

(52) U.S. Cl.
CPC ...... *H01L 21/26506* (2013.01); *G11C 11/5628* (2013.01); *G11C 16/0466* (2013.01); *G11C 16/3418* (2013.01); *H01L 21/28282* (2013.01); *H01L 27/11568* (2013.01); *H01L 29/165* (2013.01); *H01L 29/7848* (2013.01); *H01L 29/7923* (2013.01)

(58) Field of Classification Search
CPC ............ H01L 29/7842; H01L 29/7848; H01L 29/7849; H01L 29/7847
USPC .......................................................... 257/77
See application file for complete search history.

(56) References Cited

U.S. PATENT DOCUMENTS

2004/0213029 A1* 10/2004 Hirata .................... G11C 17/12 365/104
2006/0081875 A1*  4/2006 Lin et al. ........................ 257/190
2008/0185612 A1*  8/2008 Fukuda ............. H01L 21/02381 257/190

(Continued)

FOREIGN PATENT DOCUMENTS

TW           200620650         6/2006

OTHER PUBLICATIONS

"Office Action of Taiwan Counterpart Application," issued on Nov. 2, 2015, p. 1-p. 4.

*Primary Examiner* — Jae Lee
*Assistant Examiner* — Mohammed R Alam
(74) *Attorney, Agent, or Firm* — J.C. Patents

(57) ABSTRACT

A semiconductor structure has a MOSFET and a substrate to accommodate the MOSFET. The MOSFET has a gate, a source, and a drain in the substrate. A first substrate region surrounding the MOSFET is doped with a stress enhancer, wherein the stress enhancer is configured to generate a tensile stress in the MOSFET's channel and the tensile stress is along the channel's widthwise direction.

11 Claims, 6 Drawing Sheets

(56) References Cited

U.S. PATENT DOCUMENTS

| | | | |
|---|---|---|---|
| 2009/0091983 A1* | 4/2009 | Ku et al. | 365/185.33 |
| 2010/0035419 A1* | 2/2010 | Dube et al. | 438/494 |
| 2010/0059764 A1* | 3/2010 | Luo et al. | 257/77 |
| 2010/0117158 A1* | 5/2010 | Koide | H01L 29/7843 257/369 |
| 2010/0257429 A1* | 10/2010 | Noguchi | 714/763 |
| 2014/0246696 A1* | 9/2014 | Flachowsky | H01L 29/7848 257/190 |

* cited by examiner

SEMICONDUCTOR STRUCTURE

CROSS-REFERENCE TO RELATED APPLICATION

This application claims the priority benefit of U.S. provisional application Ser. No. 61/778,342, filed on Mar. 12, 2013. The entirety of the above-mentioned patent application is hereby incorporated by reference herein and made a part of this specification.

FIELD OF THE INVENTION

The present invention relates in general to a semiconductor structure, and more particularly to a MOSFET structure.

BACKGROUND

Threshold voltage is an important parameter to gauge characteristic of a MOSFET. In general, it can be used to determine when the MOSFET to be turned on when a bias is applied. For some non-volatile memory devices, such as EEPROM or Flash, the threshold voltage is used to determine the state of a memory cell in order to decide the cell is in "written" or "erase" status. With current trend of transistor density climbing, to minimize the deviation of cell's threshold voltage within a chip is more preferred to ensure a consistent and uniform performance.

The threshold voltage distribution is more crucial to a MLC (multi level cell) memory cell or cell array. FIG. 1 illustrates the distribution of threshold voltage of a 4-bit Flash MLC array. The MLC memory cell store four different voltages by charging the floating gate of a transistor to four different voltage levels such as, "1", "2", "3", and "4". Therefore, a 4-bit Flash MLC cell can store four different written states according to the charge stored in the floating gate. Unfortunately, with the conventional arrangement, the threshold voltage of the first state Vt1, or called initial state threshold voltage usually has a wider distribution MLC array (11-14 respectively represents the initial voltage state for different cell in the array) and a part of initial states may overlap with the second state. The window loss between the initial and its neighboring state can make some memory cells undistinguishable or give an error read out signal. Thus, an improvement to narrow the threshold voltage distribution for a MOSFET semiconductor structure, especially for the initial state threshold voltage is needed.

SUMMARY OF THE INVENTION

Relationship between drain saturation current $I_D$ and gate voltage $V_G$ is a characteristic of a MOSFET device. Usually, the slope can be simplified to be represented by the transconductance Gm of the device's channel. With a greater $G_m$, the $V_t$ distribution is more convergent. The $G_m$ can be defined as:

$$G_m = \frac{dI_D}{dV_G} \propto \mu$$

where $\mu$ is the mobility of the carrier travelling in the channel. Therefore, the transconductance of the device can be improved by increasing the carrier mobility $\mu$. The objective of the present invention is to increase the carrier mobility in a MOSFET device's channel and therefore achieve a more convergent $V_t$ distribution.

It is the objective of the present invention to provide a method and a semiconductor structure to reduce the threshold voltage window loss for a semiconductor cell, especially for a MOSFET of a non-volatile memory such as a ROM or a flash, by enhancing the carrier mobility in the channel in order to have a more convergent threshold voltage distribution.

In some embodiments, the memory cell is mainly constructed as an NMOS, in which an electron is the major carrier, and a p-type substrate accommodates the memory cell. Further, an exemplary depiction of a memory array is illustrated, but does not limit the scope of the present invention.

In accordance with the invention, the channel of the cell is under a tensile stress such that a higher carrier mobility can be achieved. In some embodiments, a stable impurity ion that is smaller than the substrate matrix atom is implanted into a first substrate region in the substrate, wherein the first region is between the channels of the memory cells.

In some particular embodiments, the substrate is silicon and the impurity ion is carbon. The channels are particularly along wordlines of a memory array, and the first substrate region is between the wordlines. In some embodiments, the tensile stress is along the direction of the channel width.

In some particular embodiments, the memory array is a buried diffusion array where there is no structure such as STI or LOCOS in the first substrate region. The isolation is provided by implanting impurity in the first region hence to increase the sheet resistance of the substrate.

In yet another aspect, the present invention provides a method for generating a tensile stress in a channel of a MOSFET cell. In some embodiments, a carbon ion is implanted into a silicon substrate of the MOSFET cell. The channel of the cell is excluded during the implantation process. A thermal process is introduced after the carbon implantation in order to form silicon carbide between the channels.

BRIEF DESCRIPTION OF THE DRAWINGS

The invention will be described according to the appended drawings in which.

DETAILED DESCRIPTION OF THE INVENTION

The embodiments of the present invention are described more fully hereinafter with reference to the accompanying drawings, which form a part hereof, and which show, by way of illustration, specific exemplary embodiments by which the invention may be practiced. This invention may, however, be embodied in many different forms and should not be construed as limited to the embodiments set forth herein; rather, these embodiments are provided so that this disclosure will be thorough and complete, and will fully convey the scope of the invention to those skilled in the art. As used herein, the term "or" is an inclusive "or" operator, and is equivalent to the term "and/or," unless the context clearly dictates otherwise. In addition, throughout the specification, the meaning of "a," "an," and "the" include plural references.

A memory cell array is utilized as an exemplary structure to illustrate the following embodiments, but should not be construed as a limitation to the present invention. A person with ordinary skill in this field should appreciate that the invention can be applied to any MOSFET structure, and in some particular embodiments, an n-type MOSFET structure is preferred.

Figure 2:
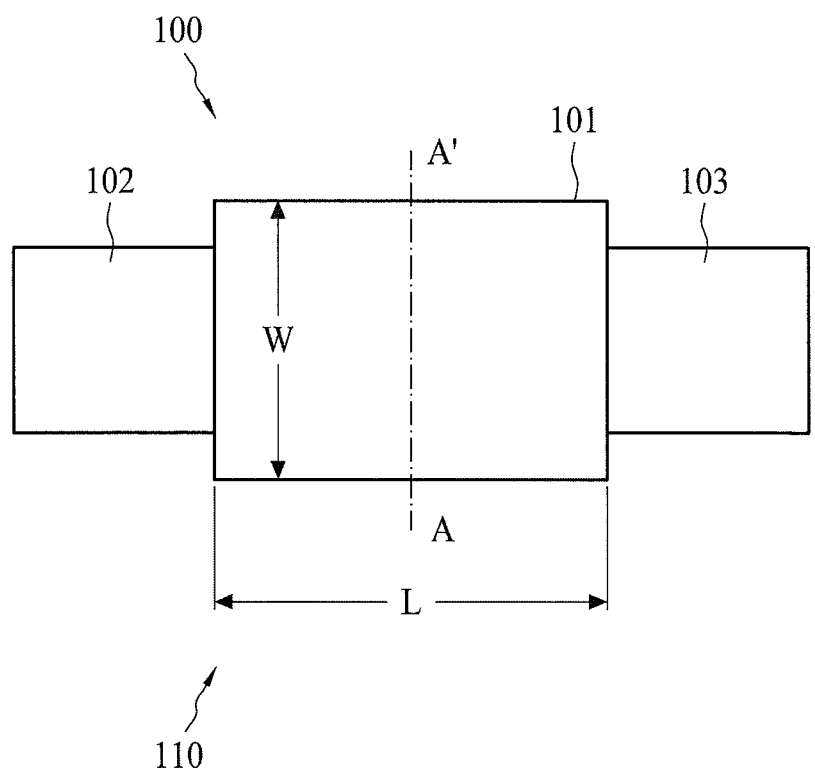
FIG. 2 illustrates a top view of a unit cell of a MOS structure of one embodiment.

FIG. 2 illustrates a top view of a unit cell of a MOS structure 10. A substrate 100 with a first conductivity type is configured to accommodate the MOS structure 10 and the MOS structure has a gate 101, a source 102, and a drain 103. A first substrate region 110 surrounds the gate line, source and drain. The first substrate region 110 can be a buried diffusion region without any isolation structure such as STI or LOCOS built in. The sheet resistivity of the first substrate region 110 can be manipulated by implanting impurity into the substrate. Typically, a higher sheet resistivity is preferred in order to keep the MOS structure 10 isolated from any neighboring devices. The gate 101 is disposed on the substrate to form a gate of the MOS structure. The source 102 and drain 103 is respectively a doped region with a second conductivity type, wherein the second conductivity type is opposite to the first conductivity type. A channel in the substrate between the source 102 and drain 103 may become conductive while a bias voltage greater than the threshold voltage of the MOS structure 10 is applied on the gate 101. The channel has a length L and a width W. The first substrate region 110 is doped with a stress enhancer, wherein the size of the enhancer is smaller than the substrate matrix atom. Optionally, a thermal annealing process can be selected in order to form a compound or crystal that includes the substrate matrix element and the enhancer, and is configured to generate a tensile stress in the channel of the MOS structure 10.

Figure 3A:
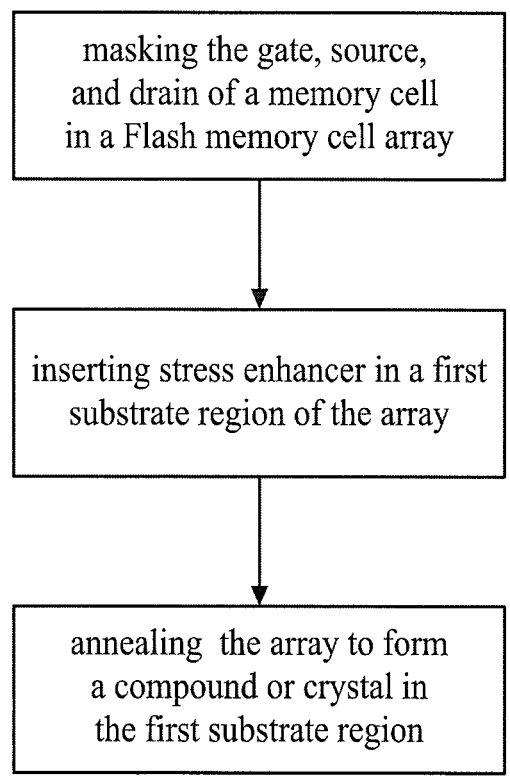
FIG. 3A is a process flow according to one embodiment.
Figure 3B:
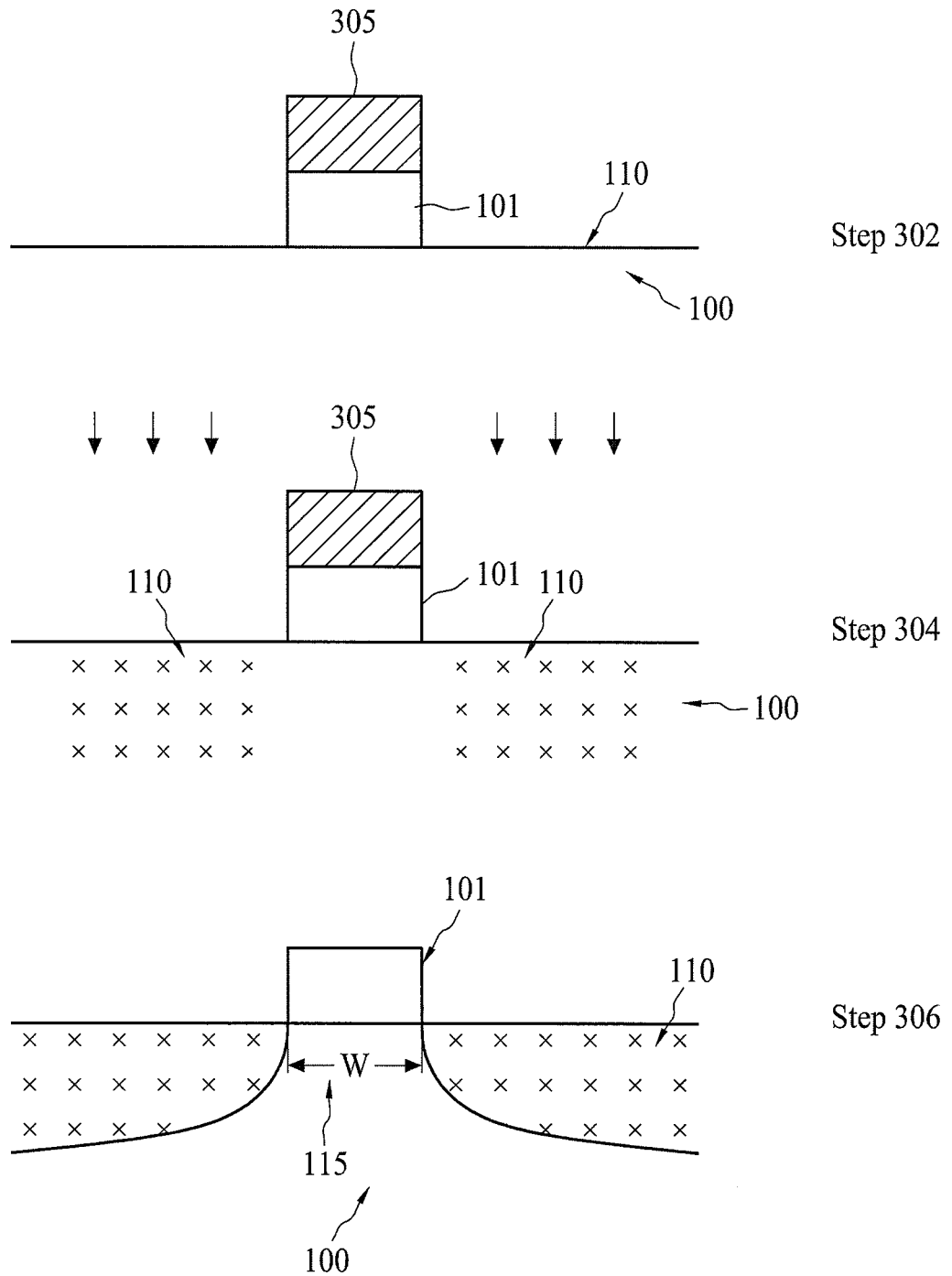
FIG. 3B is a cross-sectional view of the MOS structure of one embodiment.

In some embodiments, carbon is used as the stress enhancer and silicon is the substrate matrix atom. A process flow can be depicted in FIG. 3A, and FIG. 3B is a cross-sectional view of the MOS structure 10 along line AA'. In step 302, a mask 305 is disposed to cover the gate 101. In step 304, carbon ions or atoms are inserted into the first region 110 of the substrate. The methodology to insert the carbon into the substrate can be realized by various ways, such as ion implantation or diffusion. In step 306, a thermal annealing process is introduced to provide energy to form bonding between silicon and carbon. In some particular embodiments, crystalline silicon carbide (SiC) is formed in the substrate after the annealing process. The crystalline silicon carbide can include hexagonal (such as 2H, 4H or 6H SiC), rhombohedral (such as 15R, or 21R SiC), or cubic (such as 3C SiC) patterns. Lattice mismatching between the newly formed SiC compound or crystal and the silicon substrate generates a stress in the substrate, and generally, a tensile stress in the channel 115. In some embodiments, the tensile stress is along the channel's widthwise direction, to which the channel length is perpendicular. When the gate line 101 is under a bias that is large enough to make the channel 115 conductive, the major carriers in the channel are able to travel in the tensile-stressed channel 115. Hence, the mobility μ of the carriers is enhanced. In some embodiments, the gate 101 can be a multi-layered stack, which includes at least a charge trapping layer and a poly gate. In some embodiments, the charge trapping layer can be a dielectric stack such as ONO (oxide-nitride-oxide) which is configured to trap the charge in a localized manner. In some embodiments, the carbon concentration is between 0.5%-2.5%. In some embodiments, the carbon concentration is between 1%-1.6%.

Figure 4A:
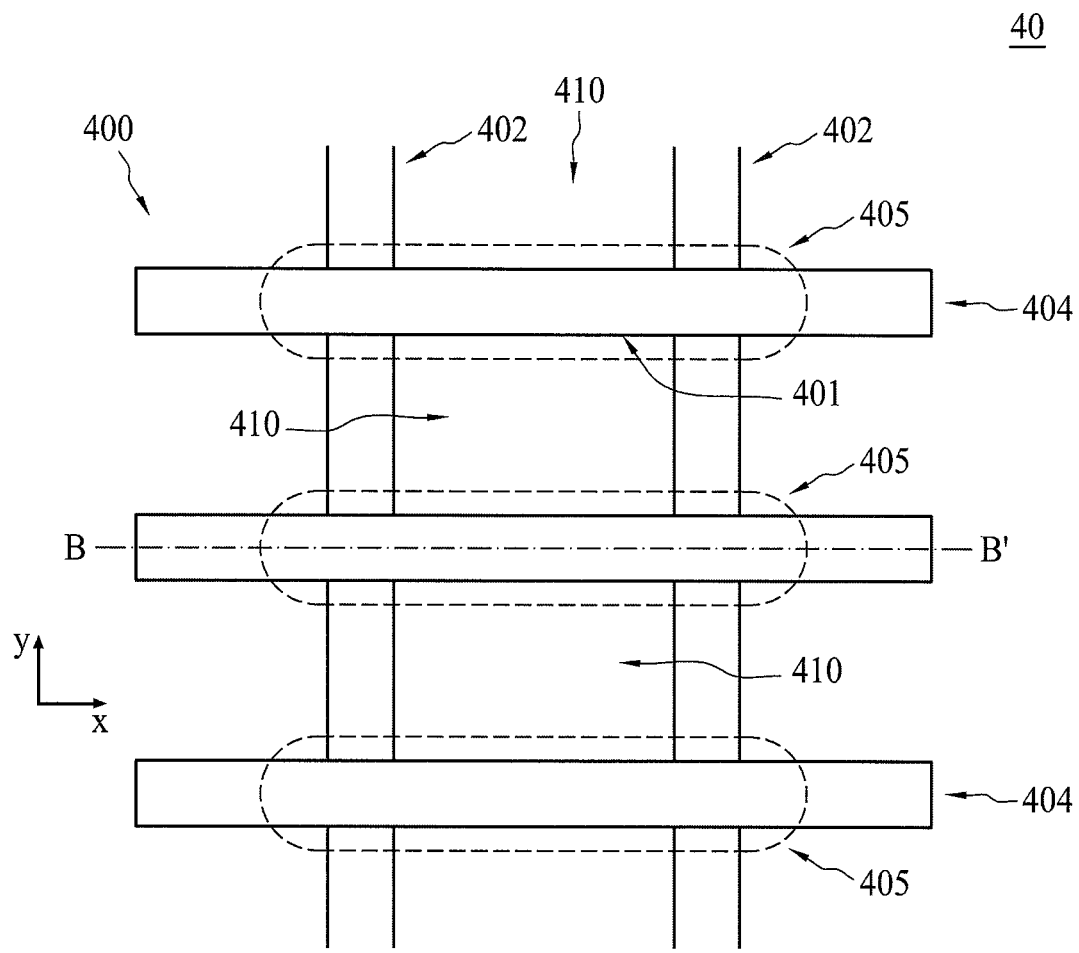
FIG. 4A is a top view of a MOSFET cell with buried diffusion array of one embodiment.
Figure 4B:
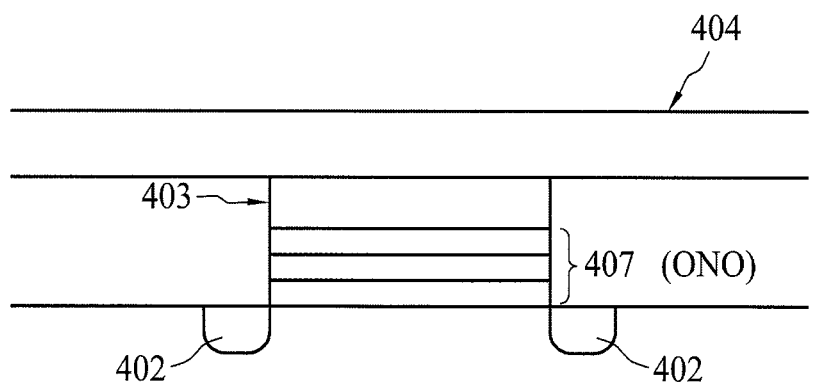
FIG. 4B is the cross-sectional of a MOSFET cell array of one embodiment.

FIG. 4A is a top view of a MOSFET cell array 40, wherein the cell array 40 has a substrate 400 and a plurality of parallel conductive lines 404. Strips 402 depict doped regions in the substrate 400 with a conductivity type that is different from the substrate 400. The array 40 can be composed with a plurality of MOSFET cells 405 (dotted circle). FIG. 4B is the cross-sectional view along line BB'. The conductive line 404 is electrically coupled to a conductive film 403 which can be the gate of the cells 405, and the doped regions 402 are the source or drain. In the present embodiment, the memory cell 405 includes an ONO film stack 407 configured to store trapping charges at both sides, and a conductive film 403 is disposed between the ONO stack 407 and the conductive line 404. In some embodiments, regions 410 between the conductive lines 404 are carbon doped and there is no structure such as STI or LOCOS built within. The sheet resistivity of the first substrate region 410 can be manipulated by implanting impurity into the substrate. Typically, a higher sheet resistivity is preferred in order to keep the conductive lines isolated from each other. The atomic concentration of carbon is about 1% to 1.6% of silicon. Carbon in the substrate can further form a SiC compound or crystal after thermal annealing. In some particular embodiments, the MOSFET cell is an n-type MOS, i.e. the doped region 402 is n-type.

In another embodiment, the MOSFET cell array is a silicon-based virtual ground array structure. The conductive lines are wordlines and arranged in a parallel manner and configured to transfer the driven bias to the gate of each unit cell where each wordline is electrically coupled. A channel is formed in the substrate 400 and located under the gate 401. Substrate regions 410, which are the regions between the wordlines 401, are doped with carbon of an atomic concentration between 1% and 1.6%. Carbon in the silicon substrate can form a SiC compound or crystal after a thermal annealing process is introduced. Due to lattice mismatching, the SiC structure with larger volume in the silicon substrate can squeeze the wordlines along the y-direction and therefore, a tensile stress along the wordline direction, is formed in the channel. Since the channel below the gate 401 is under tensile stress, the mobility of the carrier is increased.

In the aforementioned embodiments, the cell array can be a memory cell array, or a nitride-based nonvolatile memory cell array. Moreover, with the aid of thermal annealing, a SiC structure forms in the carbon-doped regions and generates a tensile-stressed channel for each memory cell; therefore, the carrier mobility can be increased. In some embodiments, the memory cell is a nitride-based nonvolatile MLC memory cell.

Figure 1:
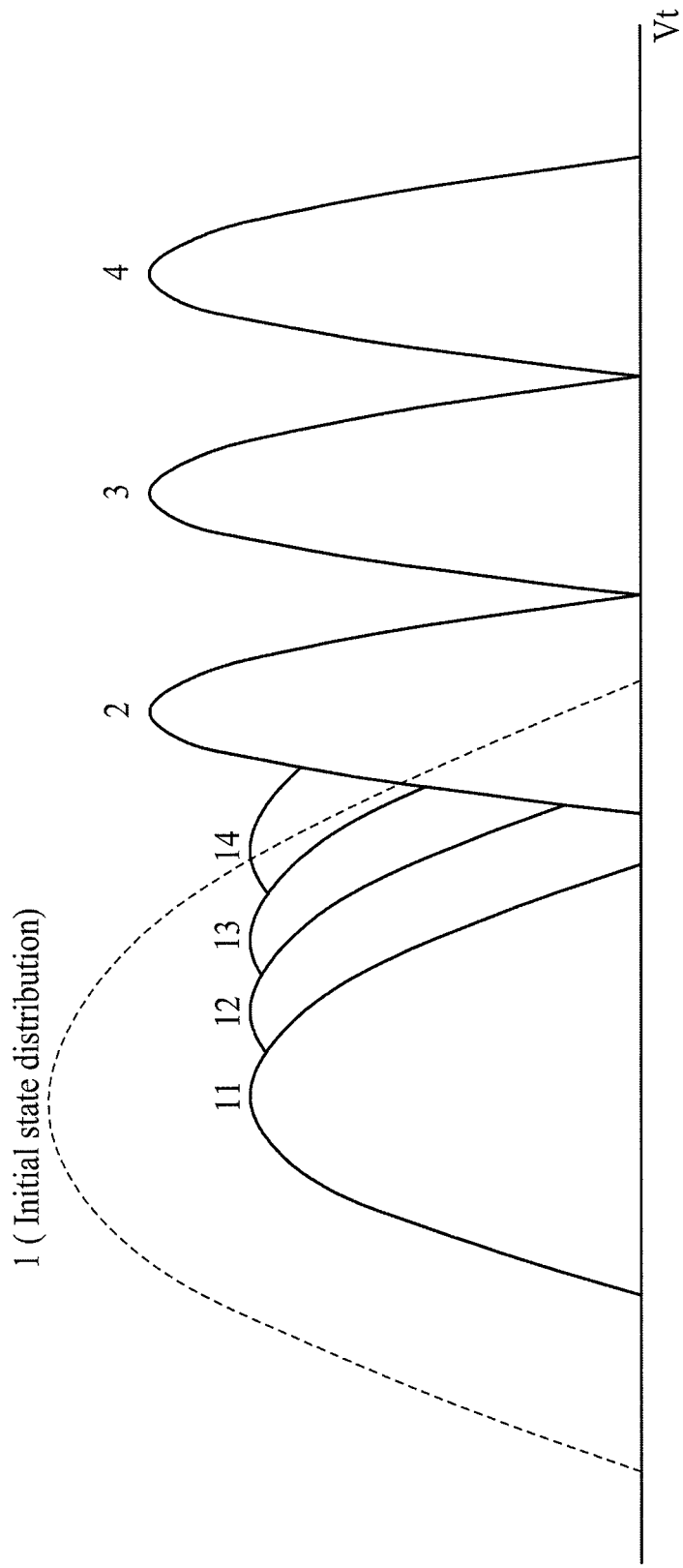
FIG. 1 illustrates threshold voltage distribution of a conventional MLC cell array with localized charge trapping.
Figure 5:
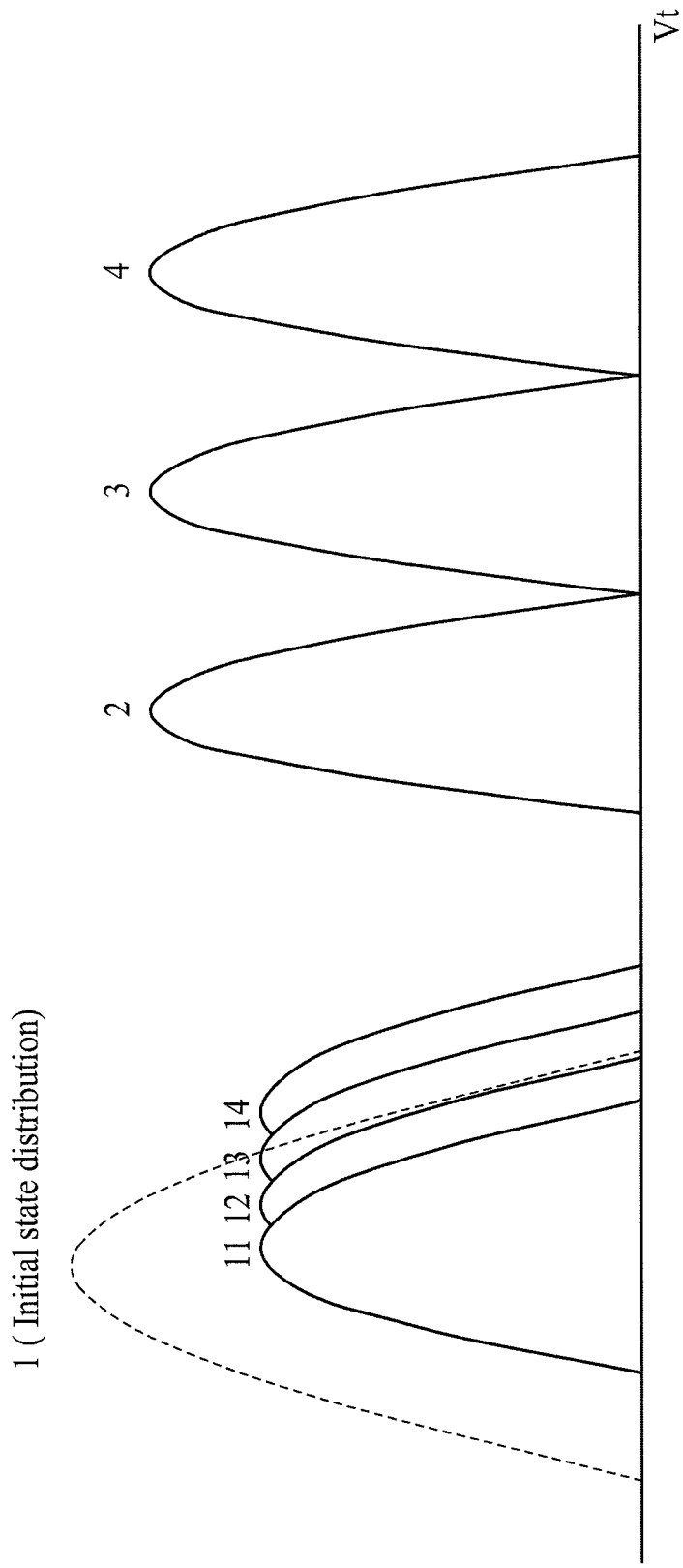
FIG. 5 shows a threshold voltage distribution chart of a MLC of one embodiment.

FIG. 5 shows a threshold voltage distribution chart of a MLC (multi-level cell) carbon-doped NMOS non-volatile memory array. It should be noted that a MLC in the present disclosure is not limited to only having four states; it can also possess more than four states as required. Apparently, the carbon-doped MLC memory array exhibits a more convergent $V_T$ distribution curve than a conventional MLC array as shown in FIG. 1. The narrower distribution of the threshold voltage can make the first state "1" distinguishable from other states.

The methods and features of this invention have been sufficiently described in the above examples and descriptions. It should be understood that any modifications or changes without departing from the spirit of the invention are intended to be covered in the protection scope of the invention.

What is claimed is:

1. A semiconductor structure comprising:
   a n-type MOSFET comprising a gate, a source, a drain, and a channel in a substrate, wherein the channel has a first opposite sides and a second opposite side, the source and the drain are disposed beside the first opposite sides; and
   a first substrate region surrounding the n-type MOSFET without STI or LOCOS structure, wherein the first substrate region is doped with carbon as a stress enhancer beside the second opposite sides of the channel, and wherein the stress enhancer is configured to generate a tensile stress in the channel, and the tensile stress is along the channel's widthwise direction.

2. The structure of claim 1, wherein the carbon concentration is between 1% and 1.6%.

3. The structure of claim 1 further comprising a silicon carbide compound or crystal in the first substrate region.

4. A MOSFET cell array comprising:
   a substrate;
   a plurality of conductive lines on the substrate, wherein the conductive lines are arranged in a parallel manner;
   a plurality of buried doped strips in the substrate, wherein the strips are crossed with the conductive lines such that a plurality of n-type MOSFET cells is formed; and
   a first substrate region between the conductive lines without STI or LOCOS structure, wherein the first substrate region is doped with carbon as a stress enhancer configured to generate a tensile stress in a channel of the n-type MOSFET cell, wherein the direction of the tensile stress is along the widthwise direction of the channel.

5. The array of claim 4, wherein the carbon concentration is between 1% and 1.6%.

6. The array of claim 4, wherein the MOSFET cell array is a nitride-based nonvolatile memory cell array.

7. The array of claim 6, wherein the conductive line is a wordline.

8. The array of claim 4 further comprising a silicon carbide compound or crystal in the first substrate region.

9. The array of claim 4, wherein the MOSFET cell array is a virtual ground array.

10. The array of claim 9 further comprising a silicon carbide compound or crystal in the first substrate region.

11. The array of claim 10, wherein the silicon carbide compound or crystal in the first substrate region is implanted.

* * * * *